United States Patent
Siemieniec et al.

(10) Patent No.: US 8,088,660 B1
(45) Date of Patent: Jan. 3, 2012

(54) METHOD FOR PRODUCING A PLUG IN A SEMICONDUCTOR BODY

(75) Inventors: Ralf Siemieniec, Villach (AT); Martin Henning Vielemeyer, Villach (AT); Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/968,817

(22) Filed: Dec. 15, 2010

(51) Int. Cl.
 *H01L 21/336* (2006.01)
(52) U.S. Cl. ........ 438/259; 438/270; 438/271; 438/589; 257/330; 257/396; 257/397
(58) Field of Classification Search .......... 438/259, 438/270–271, 589; 257/330–333, 396–397
See application file for complete search history.

(56) References Cited

U.S. PATENT DOCUMENTS

| | | | | |
|---|---|---|---|---|
| 6,066,559 A | * | 5/2000 | Gonzalez et al. | 438/672 |
| 6,602,773 B2 | * | 8/2003 | Lee et al. | 438/586 |
| 2007/0048934 A1 | * | 3/2007 | Kim et al. | 438/254 |
| 2008/0044981 A1 | * | 2/2008 | Jee et al. | 438/424 |

OTHER PUBLICATIONS

Kung et al., "Lateral epitaxial overgrowth of GaN films on sapphire and silicon substrates", Applied Physics Letters, vol. 74, No. 4, Jan. 25, 1999.

* cited by examiner

*Primary Examiner* — Dung A. Le
(74) *Attorney, Agent, or Firm* — Murphy, Bilak & Homiller, PLLC

(57) ABSTRACT

A method for producing an electrode in a semiconductor layer includes providing a substrate with a first surface and a second surface, forming a first trench having sidewalls and extending into the substrate from the first surface and forming a plug in the first trench. The method further includes reducing a thickness of the semiconductor substrate by removing semiconductor material beginning at the first surface so as to at least partially uncover sidewalls of the plug and forming a semiconductor layer on the semiconductor substrate, the semiconductor layer at least partially covering the uncovered sidewalls of the plug, and having an upper surface.

21 Claims, 7 Drawing Sheets

US 8,088,660 B1

METHOD FOR PRODUCING A PLUG IN A SEMICONDUCTOR BODY

TECHNICAL FIELD

Embodiments of the present invention relate to a method for producing a vertical plug and, in particular, relate to a method for producing an electrode, in particular an electrode extending in a vertical direction in a semiconductor layer.

BACKGROUND

Vertical electrodes or vias are electrodes which extend in a vertical direction of a semiconductor body. Such electrodes can be used in a semiconductor component to electrically connect active regions implemented in the region of a first surface of the semiconductor body with an electrode arranged above a second surface of the semiconductor body, or can be used to electrically connect active regions which are arranged in different vertical positions of the semiconductor body.

Conventionally such vertical electrodes can be produced by etching a trench into the semiconductor body and filling the trench with an electrode material. However, while trenches can be easily etched in silicon, there are semiconductor materials, like gallium nitride (GaN) or silicon carbide (SiC), which are difficult to etch or in which etching processes take a long time and therefore are expensive.

There is therefore a need to provide a method for producing a vertical electrode in a semiconductor layer including a semiconductor material which is difficult to etch, like, for example, GaN or SiC.

SUMMARY

Embodiments of the present application relate to a method for producing an electrode in a semiconductor layer, the method including: providing a substrate with a first surface and a second surface; forming a first trench having sidewalls and extending into the substrate from the first surface; forming a plug in the first trench; reducing a thickness of the semiconductor substrate by removing semiconductor material beginning at the first surface so as to at least partially uncover sidewalls of the plug; forming a semiconductor layer on the semiconductor substrate, the semiconductor layer at least partially covering the uncovered sidewalls of the at least one plug, and having an upper surface.

According to one embodiment, the plug includes an electrode. According to a further embodiment, the plug includes a sacrificial material which is removed after forming the semiconductor layer so as to form a second trench, and an electrode is formed in the second trench.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Embodiments of the present invention relate to a method for producing a plug in a semiconductor layer. The basic principle of this method can be used in a plurality of different applications. These applications may include—but are not limited to—the forming of a vertical electrode or an electrically conductive via in the semiconductor layer, or the forming of a trench in a semiconductor layer. Although the method will be explained in a specific context, namely in the context of producing a vertically extending electrode or a trench in a semiconductor layer, this method is not restricted to this specific use. Instead, this method can be used in many other fields as well.

Figure 1A:
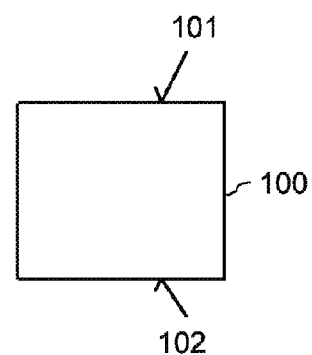
FIGS. 1A to 1E illustrate a method for producing a plug in a semiconductor body according to an embodiment.

FIGS. 1A to 1E schematically illustrate a first embodiment of a method for producing a plug in a body, in particular in a body which includes a semiconductor layer on a substrate. Referring to FIG. 1A, a substrate 100 with a first surface 101 and a second surface 102 opposite the first surface 101 is provided. FIGS. 1A to 1E show vertical cross sections through this substrate 100 in a vertical section plane, which is a section plane extending perpendicular to the first and second surfaces 101, 102.

The substrate 100 is, for example, a semiconductor substrate which includes a first semiconductor material. According to one embodiment, the substrate 100 is a semiconductor, like a silicon substrate which includes monocrystalline silicon, as the first semiconductor material. However, other types of substrates, like insulating substrates, sapphire substrates, or SOI substrates, can be used as well.

Figure 1B:
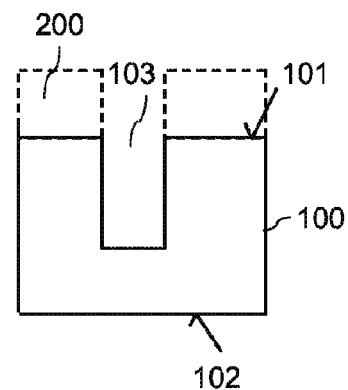

Referring to FIG. 1B at least one first trench 103 is formed. The first trench, from the first surface 101, extends into the semiconductor body 100. The first trench 103 is a vertical trench, which is a trench extending in the vertical direction of the semiconductor body 100. The vertical direction is a direction perpendicular to the first surface 101. The phrase "to extend in the vertical direction" in this context means that the first trench 103 generally extends in the vertical direction. However, sidewalls of the trench 103 do not necessarily extend in the vertical direction. Instead, these sidewalls can be inclined relative to the vertical direction. According to one embodiment, the sidewalls of the trench 103 are inclined such that the trench 103 narrows when proceeding from the top of the trench 103, which is close to the first surface 101, to the bottom of the trench 103.

The first trench 103 can be produced using conventional methods for producing trenches in a substrate, in particular a semiconductor substrate. These methods may include an etching process supported by an etch mask 200 (illustrated in dashed lines). In a method like this, the substrate 100 is etched in those areas uncovered by the etch mask 200.

Figure 1C:
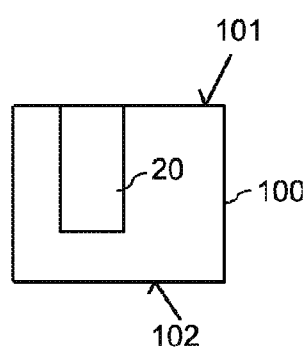

Referring to FIG. 1C a plug 20 is formed in the first trench 103. The plug 20 may completely fill the first trench 103. Referring to what will be explained hereinbelow, the plug 20 can be a homogenous plug comprised of only one material, or may be comprised of different materials. According to one embodiment, the plug 20 is a composite plug which includes several sections or layers with different materials. Whether the plug 20 is comprised of only one material, or is comprised of several materials, is dependent on the specific application.

Figure 1D:
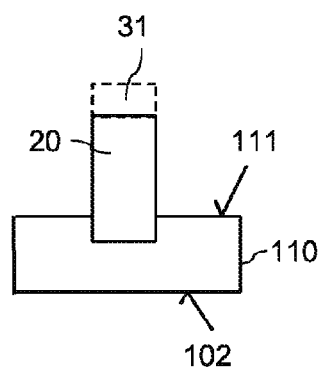

Referring to FIG. 1D, a vertical thickness of the substrate 100 is reduced by removing substrate material beginning at the first surface 101. During this process, sidewalls of the plug 20 are at least partially uncovered. In the embodiment illustrated in FIG. 1D the removal process stops before the sidewalls of the plug 20 are completely uncovered so that a bottom portion of the plug 20 remains in the substrate 100. In FIG. 1D, reference character 110 denotes those parts of the substrate 100 which remain after the removal process. Reference character 111 denotes a first surface or upper surface of the remaining substrate 110.

The removal process may include a conventional process which is suitable to partially remove the substrate 100 beginning at the first surface 101. If the substrate 100 is a semiconductor substrate a suitable process is, for example, an etching process. Dependent on the composition of the plug 20 and dependent on the specific method used for partially removing the substrate 100, a protection layer 31 is produced on top of the plug 20 before the removal process is performed. This protection layer 31 protects a top surface of the plug 20 during the removal process. The protection layer 31 is, for example, an oxide layer or a nitride layer.

Figure 1E:
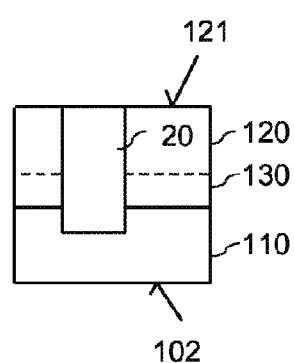

Referring to FIG. 1E a semiconductor layer 120 is produced on the first surface 111 of the substrate 110 such that the semiconductor layer 120 encloses the plug 20 in the horizontal plane and so as to cover previously uncovered sidewalls of the plug 20. In the embodiment illustrated in FIG. 1E, the semiconductor layer 120 in the vertical direction extends to the top of the plug 20, so that the plug 20 is completely enclosed by the semiconductor layer 120.

Optionally, an intermediate layer 130 (illustrated in dashed lines), which is also referred to herein as a buffer layer, is produced on the first surface 101 before the semiconductor layer 120 is produced, wherein the semiconductor layer 120 is produced on the buffer layer 130. The buffer layer 130 may include one layer or may include a layer stack with several layers. According to one embodiment, the buffer layer is an $Al_xGa_{1-x}N$ layer or an AlN layer.

The result of the method illustrated in FIGS. 1A to 1E is a semiconductor arrangement with a substrate 110, a semiconductor layer 120 arranged on top of the substrate 110, and a plug 20 extending vertically through the semiconductor layer 120. This method is especially suitable for producing vertically extending plugs, like plug 20 of FIG. 1E, in semiconductor layers, like semiconductor layer 120 of FIG. 1E, which are difficult to etch. Unlike conventional methods, in which a trench is etched into the semiconductor layer and in which the plug is produced in the etched trench, in the method of FIGS. 1A to 1E the plug is produced in a trench of a substrate before the substrate is partially removed, and the semiconductor layer is produced "around" the plug after the plug has been produced. In this method, an upper part of the substrate 100, i.e. the part in which the plug 20 has been produced, acts as a sacrificial layer which is removed and which is then replaced by the semiconductor layer 120 and the optional intermediate layer 130.

According to one embodiment, the semiconductor layer 120 includes or is comprised of gallium nitride (GaN) or includes or is comprised of silicon carbide (SiC). Of course, any other semiconductor material, in particular a compound semiconductor material, may be used as well. Those semiconductor materials are difficult to etch. However, monocrystalline layers of these materials can be epitaxially grown using an epitaxial growth process on the substrate 110 or a buffer layer 130, respectively. The buffer layer 130 is, for example, a semiconductor layer which may be comprised of the same material as the semiconductor layer 120, but may also be comprised of a different semiconductor material. The buffer layer 130 is, for example, produced by an epitaxial lateral overgrowth (ELOG) process. The buffer layer 130 allows to grow the semiconductor layer 120 which has a different material as the substrate 110 on the substrate 110. If the substrate 100 is a silicon substrate commonly "silicon processes" can be used to form the trench 103, form the plug 21 in the trench 103 and partially remove the substrate 100.

The arrangement illustrated in FIG. 1E can be a desired final arrangement. The plug 20 can comprise an electrically conductive material and may electrically connect a component region (not shown) arranged in the semiconductor layer 120 to the substrate 110. According to a further embodiment, the plug 20 includes an electrically insulating material. In this case, the plug 20 may be implemented with ring-shaped geometry (see, e.g., FIG. 4) in a horizontal plane, wherein the horizontal plane is a plane parallel to the surface 101 of the semiconductor layer 120. Such a ring-shaped plug 20 separates and insulates a semiconductor region enclosed by the plug from other semiconductor regions. In these semiconductor regions which are insulated from on another semiconductor components can be implemented which are electrically insulated from one another.

However, it is also possible to use the arrangement of FIG. 1E as a basis for additional process steps. According to one embodiment, the plug 20 is removed so as to produce a second trench in the semiconductor layer 120, wherein this trench may be filled with another plug material. Specific embodiments of the method illustrated in FIGS. 1A to 1E or subsequent method steps that can be performed based on the arrangement of FIG. 1E will be explained hereinbelow.

FIGS. 2A to 2J illustrate a method in which the method steps explained with reference to FIGS. 1A to 1E are used for producing a vertically extending electrode or an electrically conductive via, respectively. FIGS. 2A to 2J illustrate vertical cross sections through the arrangement during the individual process steps.

Figure 2A:
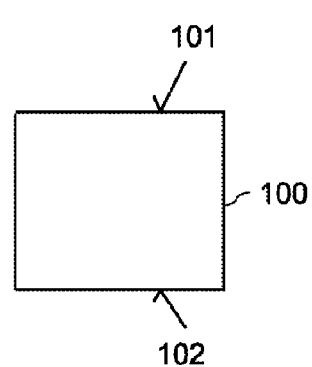
FIGS. 2A to 2J illustrate a method for producing a plug which includes an electrode according to an embodiment.
Figure 2B:
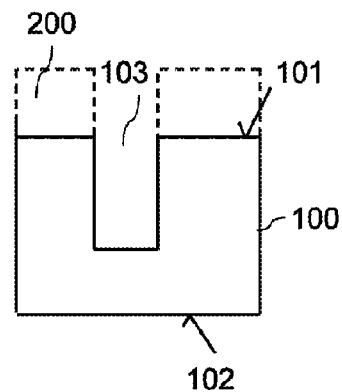

The process steps illustrated in FIGS. 2A and 2B correspond to the method steps illustrated in FIGS. 1A and 1B. In these method steps, the first trench 103 is produced in the first surface 101 of the substrate 100. For explanation purposes it is assumed that the substrate 100 is a semiconductor substrate, in particular a silicon substrate.

The plug produced in the method of FIGS. 2A to 2J is a composite plug which includes at least one vertical electrode and an insulation layer arranged between the electrode and the semiconductor layer. Method steps for producing such composite plug are explained next with reference to FIGS. 2C to 2E.

Figure 2C:
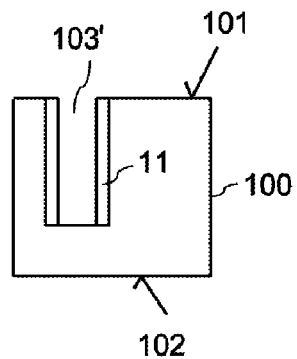
Figure 2D:
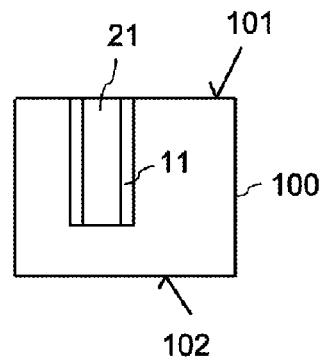

Referring to FIG. 2C an insulation layer 11 is produced on the sidewalls of the first trench 103 such that a residual trench 103' remains. Referring to FIG. 2D an electrode layer 21 is produced on the insulation layer 11. This electrode layer 21 can be produced such the electrode layer 21 covers the insulation layer 11 so as to leave a further (smaller) residual trench (not illustrated) or such that the electrode layer 21 completely fills the residual trench 103' as illustrated in FIG. 2D. In the method illustrated in FIGS. 2C and 2D the insulation layer 11 is produced only on the sidewalls of the trench 103 so that the electrode 21 adjoins the substrate 100 at the bottom of the trench 103 while it is insulated from the substrate in the horizontal direction. The insulation layer 11 is, for example, an oxide layer, like a deposited oxide or a thermally grown oxide, or is a nitride layer. However, any other insulation layer which is compatible with the semiconductor material may be used as well. In this regard thermally grown oxides cannot be produced in each semiconductor material. While a thermally grown oxide can be produced on silicon or silicon carbide, it cannot be produced on gallium nitride. The electrode 21 includes, for example, at least one of a metal, like tungsten (W), copper (Cu), aluminum (Al); a silicide; or a highly doped polycrystalline semiconductor material, like polysilicon.

Figure 2E:
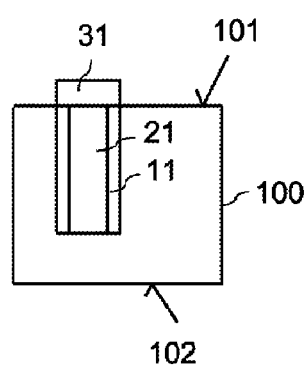
Figure 2F:
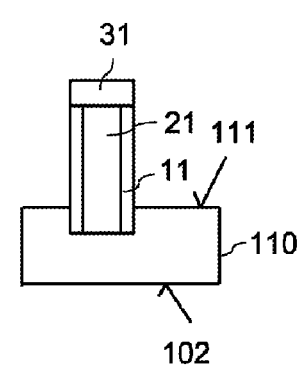

Referring to FIG. 2E, an optional protection layer 31 is produced on the top surface of the composite plug with the insulation layer 11 and the electrode 21. This protection layer 31 includes, for example, an oxide, like a silicon oxide ($SiO_2$), or a nitride, like a silicon nitride (SiN). The protection layer 31 protects the composite plug during subsequent method steps in which, referring to FIG. 2F, the substrate 100 is partially removed so as to at least partially uncover the insulation layer 11. Partially removing the substrate 100 includes, for example, an etching process which etches the substrate 100. The etching process includes a selective etching process which etches the material of the substrate 100 selectively relative to the plug, which, referring to the method of FIGS. 2A to 2J, means selectively relative to the insulation layer 11. The etching process can be an anisotropic or an isotropic etching process. Etching processes which etch a semiconductor substrate, like substrate 100 according to FIG. 2E, selectively relative to an insulation layer, like insulation layer 11 of FIG. 2E, are commonly known, so that no further explanations are required in this regard.

Figure 2G:
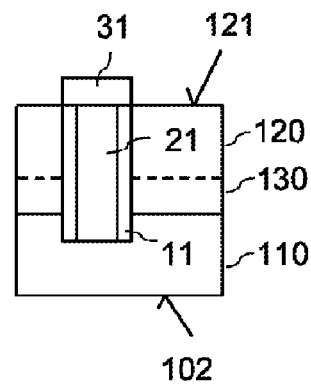

Referring to FIG. 2G the semiconductor layer 120 is produced on the remaining part of the substrate 110. The semiconductor layer 120 is, for example, a GaN layer or a SiC layer, wherein optionally a buffer layer 130 is produced on the substrate 110 before producing the semiconductor layer 120. These method steps correspond to the method steps which have already been explained with reference to FIG. 1E.

The electrode 21 extending vertically through the semiconductor layer 120 and extending into the substrate 110 can be used to electrically connect semiconductor regions in the semiconductor layer 120 with an electrode arranged on a surface of the substrate 110 opposite to a surface 121 of the semiconductor layer. Additional method steps for producing such an electrical connection will be explained with reference to FIGS. 2H to 2J.

Figure 2H:
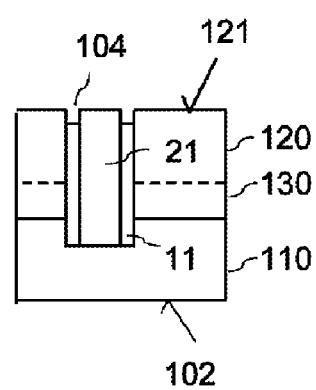

Referring to FIG. 2H the insulation layer 11 is removed between the electrode 21 and the semiconductor layer 120 in a region below the surface 121 of the semiconductor layer 120. Partially removing the insulation layer 11 includes, for example, an etching process which etches the insulation layer 11 selectively relative to the electrode 21 and the semiconductor layer 120. Such etching processes are commonly known so that no further explanations are required in this regard. The result of partially removing the insulation layer 11 between the electrode 21 and the semiconductor layer 120 is a gap 104 between the electrode 21 and the semiconductor layer 120.

Figure 2I:
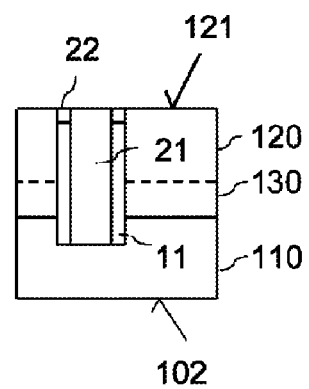

Referring to FIG. 2I, this gap 104 is filled with an electrode material which forms an electrically conducting connection 22 between the electrode 21 and the semiconductor layer 120. The electrode material forming this electrically conductive connection 22 is, for example, the same material which was used for producing the vertical electrode 21. However, it is also possible to use another electrically conductive material to fill the gap 104.

Instead of forming the electrically conductive connection 22 after the plug 21 has been formed, it is also possible to already form this connection 22 when the plug 21 is formed. For this, the insulation layer 11 can be removed from the sidewalls in a top region of the first trench 103 in the method step illustrated in FIG. 2C, wherein the top region of the first trench 103 is a region close to the first surface 101. This can be achieved by performing the (anisotropic) etching process longer than it is required to merely remove the insulation layer 11 from the first surface 101 and the bottom of first trench 103. The plug 21 and the connection region 22 are then formed together in the process step which has been explained with reference to FIG. 2D, in which the trench 103 is filled with a conductive material.

Figure 2J:
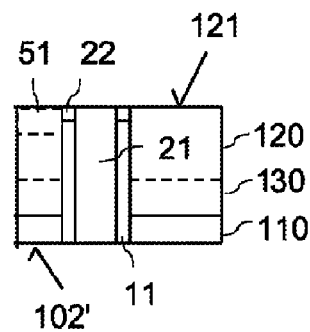

Referring to FIG. 2J, the substrate 110 is partially removed at its second surface 102 so as to uncover a bottom region of the vertical electrode 21. The bottom region of the vertical electrode 21 is the region of the electrode 21 which adjoins the substrate 110 before the removing process illustrated in FIG. 2J is performed. The electrode 21 can be electrically contacted at its bottom region, so as to electrically contact the active region 51 arranged in the region of the surface 121 of the semiconductor layer 120 via the electrode 21 and via the electrically conductive connection 22. The active region 51 is, for example, an active region of a transistor component, like a High Electron Mobility Transistor (HEMT).

Figure 3:
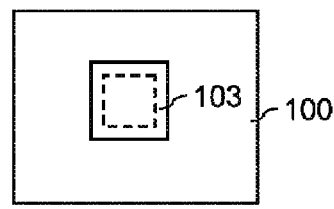
FIG. 3 illustrates a horizontal cross section through the plug or through the trench in which the plug has been produced according to an embodiment.
Figure 4:
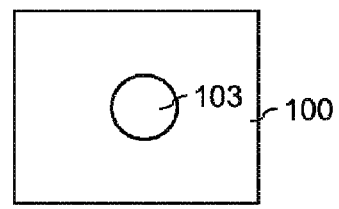
FIG. 4 illustrates a horizontal cross section through the plug or through the trench in which the plug has been produced according to another embodiment.
Figure 5:
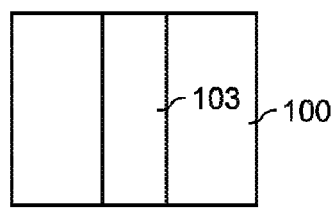
FIG. 5 illustrates a horizontal cross section through the plug or through the trench in which the plug has been produced according to yet another embodiment.

In the horizontal plane, the plug may have any suitable geometry. The geometry of the plug is defined by the geometry of the trench (103 in FIGS. 1B and 2B) produced in the substrate 100. FIGS. 3 to 5 show horizontal cross sections through the substrate 100 with the trench 103 in order to illustrate examples of different horizontal geometries. The trench 103, referring to FIG. 3, can have a rectangular, in particular a square geometry, can have an elliptical, in particular a circular, geometry (see FIG. 4), or can have a longitudinal geometry or stripe-shaped geometry (see FIG. 5). However, the geometries illustrated in FIGS. 3 to 5 are only examples. Any other suitable geometry can be used as well. FIGS. 3 to 5 only show sections of the semiconductor body 110. Thus, the longitudinal trench illustrated in FIG. 5 does not necessarily extend to an edge (not shown) of the semiconductor body 100, but may terminate distant to the edge.

Referring to FIG. 4, the trench 103 (and, therefore, the resulting plug 20) may also have a ring-shaped geometry (shown in dashed lines). In FIG. 4, the ring is a rectangular ring. However, this is only an example. The ring could also have a circular or any other ring-geometry.

The geometry of the plug is defined by the geometry of the trench 103. Consequently the geometry of the vertical electrode illustrated in FIG. 2J is also defined by the geometry of the trench 103.

Figure 6A:
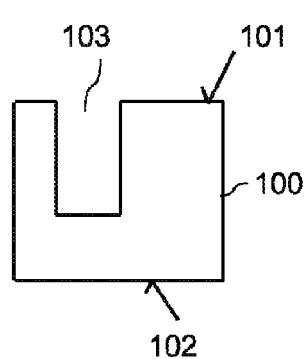
FIGS. 6A to 6C illustrate a method for producing an insulation layer on sidewalls of a trench according to an embodiment.
Figure 6B:
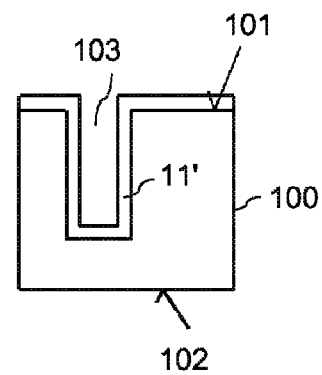
Figure 6C:
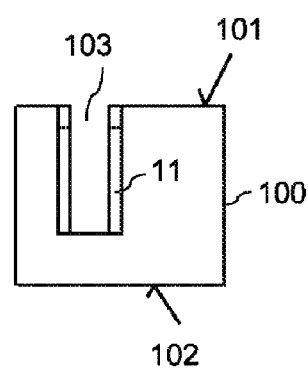

FIGS. 6A to 6C illustrate an embodiment of a method for producing the insulation layer 11 only at the sidewalls of the first trench 103, as illustrated in FIG. 2C. Referring to FIGS. 6A and 6B, after forming the first trench 103 an insulation layer 11' is formed on the first surface 101 and on surfaces of the first trench 103, i.e. on the sidewalls and the bottom of the first trench 103. The insulation layer 11' is, for example, an oxide layer, a nitride layer or a composite layer with different insulating sub-layers. An oxide layer can be produced by a thermal oxidation process or a deposition process. A nitride layer can be produced by a deposition process, and a composite layer can be produced using several of such oxidation and/or deposition processes.

Referring to FIG. 6C, the insulation layer 11' is removed from the first surface 101 of the substrate 100 and from the bottom of the first trench 103 so as to only form the insulation layer 11 on the sidewalls of the first trench 103. The removal process includes, for example, an anisotropic etching process. According to a further embodiment (illustrated in dotted lines in FIG. 6C) the insulation layer 11 is also removed from the sidewalls in a top region of the first trench 103, wherein the top region of the first trench 103 is a region close to the first surface 101. This can be achieved by performing the (anisotropic) etching process longer than necessary to merely remove the insulation layer 11 from the first surface 101 and the bottom of first trench 103.

Figure 7A:
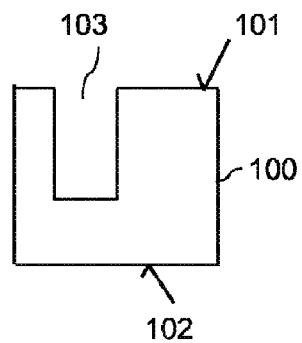
FIGS. 7A to 7F illustrate a method for producing a trench in a composite semiconductor body including at least two different semiconductor layers according to an embodiment.
Figure 7B:
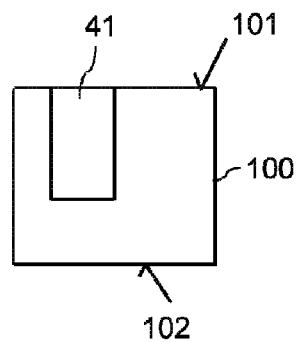

FIGS. 7A to 7F illustrate a method for producing a trench extending through the semiconductor layer 120. In this method, the plug produced in the first trench 103 acts as a sacrificial plug which is removed after forming the semiconductor layer 120. Referring to FIGS. 7A and 7B the first trench 103 is formed in the substrate 100 and the plug 41 is formed in the first trench 103, wherein the plug 41 completely fills the first trench 103. The plug can include an electrically insulating or an electrically conductive material, wherein the plug material is selected such that it can be etched selectively relative to the substrate 100 and relative to the semiconductor layer 120 produced in later method steps. The plug 41 can be comprised of only one material, or can be a composite plug which includes several material layers.

Although the plugs 21 and 41 explained hereinbefore completely fill the first trench 103, this is only one option. According to further embodiments the plugs 21 and 41 partly fill the first trench, which means that these plugs do not necessarily extend to the first surface 101.

Figure 7C:
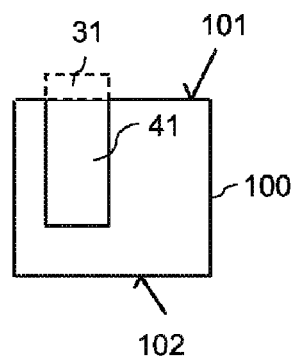
Figure 7D:
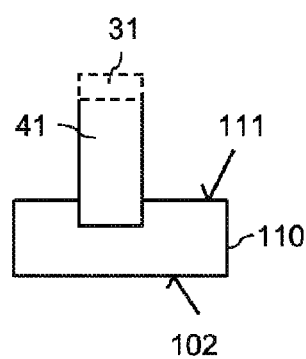
Figure 7E:
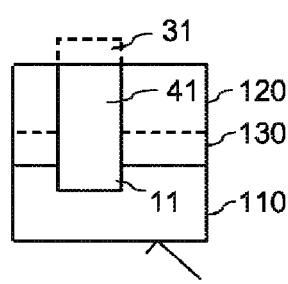

Referring to FIG. 7C, the optional protection layer 31 is produced on top of the plug 41. Referring to FIGS. 7D and 7E the substrate 100 is partially removed, and the semiconductor layer 120 and the optional buffer layer 130 are produced on the first surface 111 of the remaining substrate 110. These method steps correspond to the method steps which have been explained with reference to FIGS. 1D to 1E to which reference is made. According to one embodiment, the optional protection layer 31 is removed before the semiconductor layer 120 is deposited.

Figure 7F:
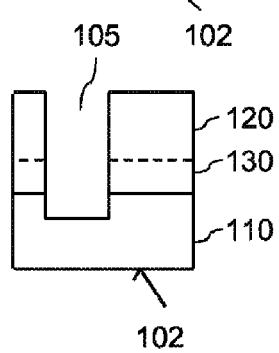

Referring to FIG. 7F, the plug 41 and the optional protection layer 31 are removed. This removal process includes, for example, an etching process which etches the material of the plug 41 selectively relative to the substrate 110 and the semiconductor layer 120, as well as selectively relative to the optional buffer layer 130.

Removing the plug 41 results in a second trench 105 which extends through the semiconductor layer 120 and the optional buffer layer 130 into the substrate 110. According to one embodiment, an electrode is formed in this second trench 105.

Figure 8:
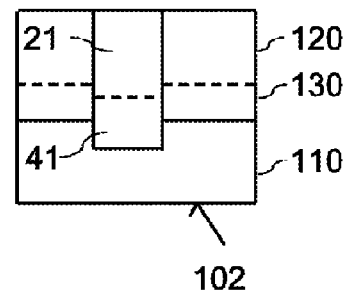
FIG. 8 illustrates a vertical cross section through a semiconductor arrangement which is based on the arrangement illustrated in FIG. 7F.

Referring to FIG. 8, an electrode 21 can be produced in the second trench 105 such that it adjoins the semiconductor layer 120, i.e. contacts the semiconductor layer 120. In the embodiment illustrated in FIG. 8, the electrode 21 completely fills the trench. However, this is only an example. According to a further embodiment, the electrode 21 only covers the sidewalls and bottom of the trench. In subsequent method steps the substrate 110 can be removed at the second surface 120 so as to uncover a bottom region of the electrode 21.

According to one embodiment, the sacrificial plug 41 is not completely removed, but a part of the plug 41 remains at the bottom of the second trench before the electrode 21 is formed. A part of the sacrificial plug remaining at the bottom of the second trench 105 is illustrated in FIG. 8.

Figure 9A:
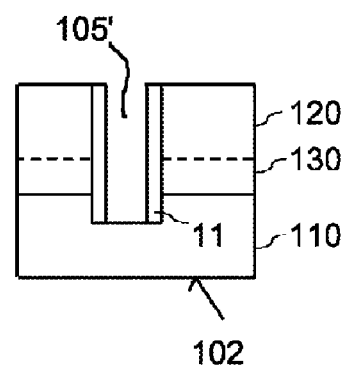
FIGS. 9A to 9C illustrate a method for producing a semiconductor arrangement which is based on the semiconductor arrangement illustrated in FIG. 7F.
Figure 9B:
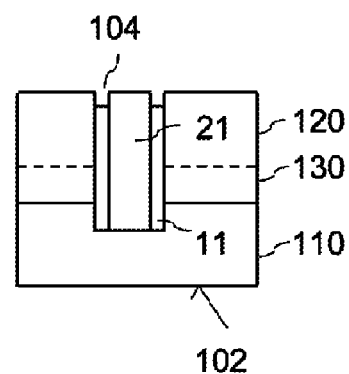
Figure 9C:
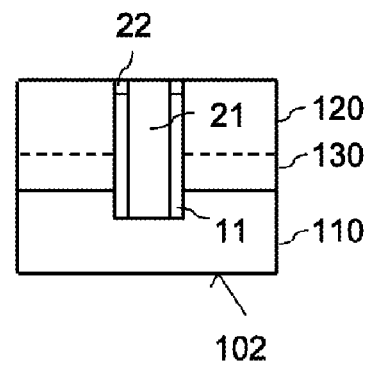

Referring to FIGS. 9A to 9C an electrode 21 is formed in the second trench 105 which is dielectrically insulated from the semiconductor layer 120 by an insulation layer 11. The method steps for producing such electrode 21 in the second trench 105 correspond to the method steps explained with reference to FIGS. 2B to 2D and FIGS. 2H and 2I. These method steps include: producing the insulation layer 11 on the sidewalls of the second trench 105 so that a residual trench 105' remains (FIG. 9A); producing the electrode 21 at least on the sidewalls and the bottom of the residual trench 105' and forming gaps 104 between the electrode 21 and the semiconductor layer 120 by partially removing the insulation layer 11 in the region of the surface 121 of the semiconductor layer 120 (see FIG. 9B); and forming an electrode material 22 in the gaps. The resulting structure which is illustrated in FIG. 9C corresponds to the structure illustrated in FIG. 2I. The method steps illustrated with reference to FIG. 2J can be applied to the arrangement illustrated in FIG. 9C as well, in order to contact the electrode 21 at the second surface 102' of the substrate 110.

Figure 10:
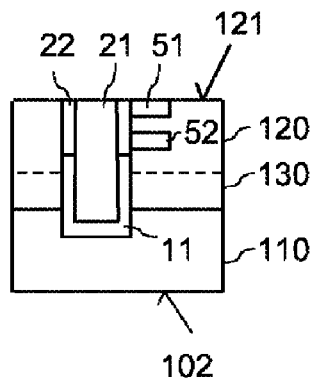
FIG. 10 illustrates a further embodiment of a semiconductor arrangement.

In some of the embodiments explained previously herein, the substrate 110 is partially removed at the second surface 102 so as to uncover a bottom region of the electrode 21. In an arrangement obtained through this, a semiconductor region, like region 51 in FIG. 2J, can be electrically connected through the vertical electrode 21 to a contact at the opposite surface of the arrangement. However, this is only an example. The methods explained hereinbefore can also be used to produce a vertical extending electrode 21 which does not extend to the second surface. An embodiment of such an arrangement is illustrated in FIG. 10. In this arrangement, the substrate 110 is not necessarily removed at the surface 102 opposite to the surface 121 of the semiconductor layer 120. The substrate 110 can be removed at the surface 102 opposite to the surface 121. In such removal process, however, the vertical electrode 21 does not have to be exposed at the surface 102. In this arrangement, the electrode 21 is electrically insulated from the substrate 110 at its bottom region. For this, the insulation layer 11 is not only present at the sidewalls of the electrode 21 but also below the bottom of the electrode 21.

The portion of the insulation layer 11 below the electrode 21 can easily be produced by modifying the method according to FIGS. 6A to 6C such that in the method step illustrated in FIG. 6B the insulation layer 11' is removed from the first surface 101 of the substrate 100 but not from the bottom of the trench 103. For this, a protection layer (not shown) can be produced on the insulation layer 11' at the bottom of the trench 103 before the process steps of the removal process are carried out. Alternatively, the plug 21 is formed before the insulation layer is removed from the surface 121. In this case, the plug 21 protects the insulation layer 11 at the bottom of the trench 103 during the removal process in which the insulation layer is removed from the surface 121. The removal process may include an etching process or a chemical-mechanical polishing (CMP) process.

In the arrangement of FIG. 10, in which the electrode 21 does not completely extend through the arrangement with the substrate 110 and the semiconductor layer 120, the electrode 21 electrically connects two or more active regions 51, 52 which are arranged on different vertical levels in the semiconductor layer 120. In the embodiment illustrated in FIG. 10, a first one 51 of the two active regions is arranged close to the surface 121, wherein a second one 52 is arranged distant to the surface 121. The electrode 21 is electrically connected to these active regions 51, 52 by an electrically conductive connection 22. This electrically conductive connection 22 can be produced using the method steps previously explained with reference to FIGS. 2H and 2I by partially removing the insulation layer 11 so as to form a gap between the electrode 21 and the semiconductor layer 120 with the active regions 51, 52, and by subsequently filling the gap with an electrode material, or by already removing a part of the insulation layer 11 before forming the plug 21. The depth of the gap (104 in FIG. 2H) is selected such that both of the active regions 51, 52 adjoin the gap before filling the gap with an electrode material. This ensures that both active regions 51, 52 are electrically connected to the vertical electrode 21.

Figure 11:
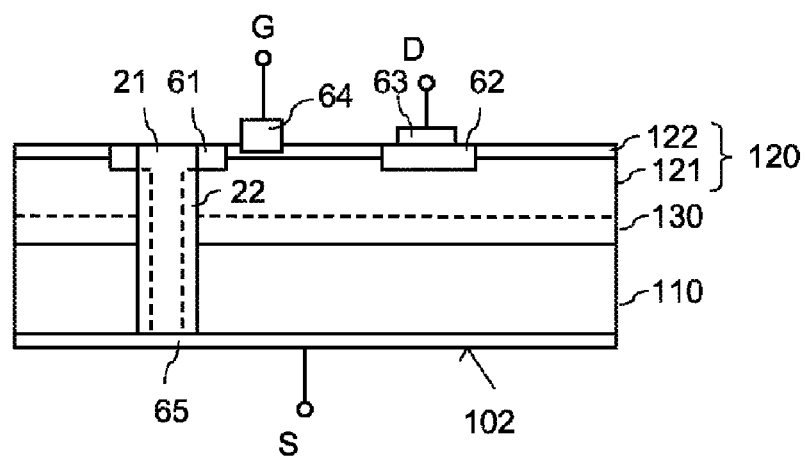
FIG. 11 illustrates a vertical cross sectional view of a first embodiment of a transistor.

FIG. 11 shows a vertical cross sectional view of a transistor, in particular a HEMT (High Electron Mobility Transistor) which includes a plug produced in accordance with one of the methods explained hereinbefore. The transistor includes a source region 61 and a drain region 62 which are arranged in the semiconductor layer 120. In this embodiment, the semiconductor layer 120 includes two layers: a first layer 121 on the substrate 110 or the optional buffer layer 130; and a second layer 122 on the first layer 121. The first layer 121 is, for example, a GaN layer, while the second layer 122 is, for example, an AlGaN layer. The source and drain regions 61, 62 are arranged distant to one another in a horizontal direction of the semiconductor layer 120 and each extend through the second layer 122 into the first layer 121. A gate electrode 64 forming a gate terminal G contacts the second layer 122 in a region between the source and drain region 61, 62 and serves to control a conducting channel along an interface between the first and second layers 121, 122. This basic structure of an HEMT, in particular an GaN HEMT is commonly known so that no further explanation is required in this regard.

In the transistor of FIG. 11, the drain region 62 is electrically connected to a drain electrode 63 arranged above the semiconductor layer 120 and forming a drain terminal. The source region 61 is electrically connected to a source electrode 65 arranged on the second surface 102 of the substrate 110 through an electrically conductive plug 21 which contacts the source region 61 and which extends through the semiconductor layer 120 and the substrate 110 to the source electrode 65. According to one embodiment the plug 21 is electrically insulated from other regions than the source region 61 by an insulation layer 22 (shown with dashed lines). Such a plug can, for example, be produced using the method steps illustrated in FIGS. 2A to 2J. According to another embodiment, the insulation layer 22 is omitted.

Figure 12:
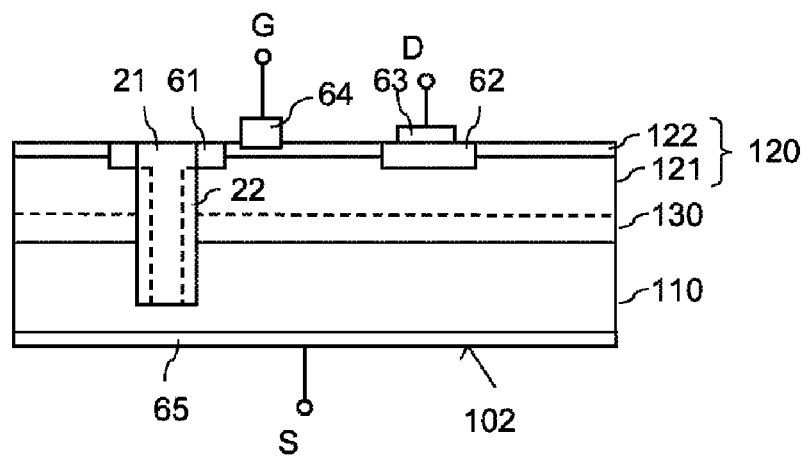
FIG. 12 illustrates a vertical cross sectional view of a second embodiment of a transistor.

FIG. 12 illustrates a modification of the transistor arrangement of FIG. 11. In the embodiment of FIG. 12, the plug 21 extends into the substrate 110 but does not extend down to the source electrode 65. In this embodiment, the substrate 110 is electrically conductive, like a highly doped semiconductor substrate, and electrically connects the plug 21 to the source electrode 65.

In the transistor arrangements of FIGS. 11 and 12 the drain region 62 instead of the source region 61 may be connected to an electrode on the surface 102 of the substrate 110.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing an electrode in a semiconductor layer, the method comprising:
   providing a semiconductor substrate with a first surface and a second surface;
   forming a first trench having sidewalls and extending into the semiconductor substrate from the first surface;
   forming a plug in the first trench;
   reducing a thickness of the semiconductor substrate by removing semiconductor material beginning at the first surface so as to at least partially uncover sidewalls of the plug; and
   forming a semiconductor layer on the semiconductor substrate, the semiconductor layer at least partially covering the uncovered sidewalls of the plug, and having an upper surface.

2. The method of claim 1, wherein the plug comprises an electrically conductive material.

3. The method of claim 1, wherein the plug comprises an insulating material.

4. The method of claim 1, wherein the substrate comprises silicon.

5. The method of claim 1, wherein the semiconductor layer comprises GaN or SiC.

6. The method of claim 1, further comprising:
   forming an intermediate layer on the semiconductor substrate; and
   forming the semiconductor layer on the intermediate layer.

7. The method of claim 6, wherein the intermediate layer comprises at least one of AlN, $Al_xGa_{1-x}N$, or a semiconductor material.

8. The method of claim 7, wherein the semiconductor layer is produced by an epitaxial lateral overgrowth process.

9. The method of claim 1, wherein forming the plug comprises:
   forming an insulation layer at least on the sidewalls of the first trench so as to leave a residual trench;
   forming an electrode layer on the insulation layer in the residual trench so as to form an electrode in the residual trench.

10. The method of claim 9, wherein the insulation layer is formed only on the sidewalls of the first trench.

11. The method of claim 9, wherein the insulation layer is formed on the sidewalls and a bottom of the first trench.

12. The method of claim 9, wherein the electrode layer completely fills the residual trench.

13. The method of claim 9, further comprising removing semiconductor material of the semiconductor substrate at the second surface so as to uncover a bottom region of the electrode.

14. The method of claim 9, further comprising:
partially removing the insulation layer in a region of the upper surface of the semiconductor layer so as to form a gap between the electrode and the semiconductor layer.

15. The method of claim 14, further comprising:
filling the gap with an electrode material.

16. The method of claim 1, further comprising:
removing the plug so as to form a second trench;
forming an electrode in the second trench.

17. The method of claim 16, wherein the plug comprises an insulating material.

18. The method of claim 16, wherein forming the electrode comprises:
forming an insulation layer at least on sidewalls of the second trench so as to form a residual trench within the second trench; and
forming an electrode layer on the insulation layer in the residual trench.

19. The method of claim 18, wherein the electrode layer completely fills the residual trench.

20. The method of claim 16, further comprising:
removing semiconductor material of the semiconductor substrate at the second surface so as to uncover a bottom region of the electrode.

21. The method of claim 18, further comprising:
partially removing the insulation layer in a region of the upper surface of the semiconductor layer so as to form a gap between the electrode and the semiconductor layer.

* * * * *